United States Patent [19]
Drake et al.
[11] Patent Number: 4,999,077
[45] Date of Patent: Mar. 12, 1991

[54] METHOD OF FABRICATING FULL WIDTH SCANNING OR IMAGING ARRAYS FROM SUBUNITS

[75] Inventors: Donald J. Drake, Rochester; Michael R. Campanelli, Webster; Cathie J. Burke, Rochester; Diane Atkinson, Marion, all of N.Y.

[73] Assignee: Xerox Corporation, Stamford, Conn.

[21] Appl. No.: 401,379

[22] Filed: Aug. 31, 1989

[51] Int. Cl.[5] .......... B32B 31/00

[52] U.S. Cl. .......... 156/299; 29/464; 29/834; 136/244; 156/241; 156/265; 156/281; 250/578.1; 437/209

[58] Field of Search .......... 156/299, 281, 241, 265; 29/464, 834; 250/578.1; 437/209; 136/244

[56] References Cited

U.S. PATENT DOCUMENTS

| | | | |
|---|---|---|---|
| 3,565,719 | 2/1971 | Webb | 437/209 |
| 4,645,688 | 2/1987 | Makino et al. | 427/82 |
| 4,690,391 | 9/1987 | Stoffel et al. | 269/21 |
| 4,712,018 | 12/1987 | Stoffel et al. | 250/578 |
| 4,735,671 | 4/1988 | Stoffel et al. | 156/304.3 |

OTHER PUBLICATIONS

IBM Technical Disclosure Bulletin; "Chip Protective Coating"; Martin et al.; vol. 23; No. 5; Oct. 1980.

*Primary Examiner*—John J. Gallagher
*Attorney, Agent, or Firm*—Robert A. Chittum

[57] ABSTRACT

A method for fabricating a coplanar full width scanning array from a plurality of relatively short scanning subunits for reading and writing images. The subunits are fixedly mounted in an end-to-end relationship on a flat structural member with the subunit surfaces containing the scanning elements all being coplanar even though at least some of the subunits have varying thickness. This is accomplished by forming from a photopatternable thick film layer one or more keys on the subunit surface having the scanning elements and associated circuitry and positioning the keys into keyways produced from a photopatternable thick film layer on a flat surface of an alignment fixture. A conformal adhesive bonds a structural member to the assembled subunits to form the full width scanning array.

7 Claims, 4 Drawing Sheets

Y
Z
X
$\Theta_1$
$\Theta_2$
$\Theta_3$
20
18
27
21
22
29
32
28
31
23
24
25

METHOD OF FABRICATING FULL WIDTH SCANNING OR IMAGING ARRAYS FROM SUBUNITS

BACKGROUND OF THE INVENTION

1. Field of the Invention

This invention relates to full width scanning arrays, and more particularly to a method for fabricating coplanar full width scanning arrays from a plurality of relatively short scanning subunits placed into precision end-to-end relationship even though some of the subunits may have different thickness.

2. Description of the Prior Art

It is well known in the raster scanning industry to assemble pagewidth raster input scanning (RIS) and raster output scanning (ROS) bars from relatively short RIS/ROS subunits placed end-to-end. Once assembled, the pagewidth RIS/ROS bars or scanning arrays have the requisite length and number of image processing elements to scan an entire line of information at once with a high image resolution. The subunits have either image reading arrays which comprise a succession of image sensing elements to convert the image line into electrical signals or pixels or image writing arrays which comprise a succession of light producing or other elements employed to produce images in response to an image signal or pixel input.

The prior art has failed to provide a means for fabricating a pagewidth scanning or imaging array from subunits which has adequate precise alignment tolerance in X, Y, and Θ space and which is commercially (i.e. economically) feasible. Further, the prior art has failed to provide such a pagewidth scanning array when an additional requirement of uniformity in the Y space direction is necessary. By Y space direction, it is meant coplanarity of the surfaces of the subunits making up the pagewidth scanning array. The prior art solutions to overcome this inability to provide cost effective pagewidth scanning arrays include optical and electrical arrangements for overlapping several short arrays and abutting short arrays together end-to-end. However, none of these attempts have met with any great degree of success. For example, in the case of abutting smaller arrays together, losses and distortions of the pagewidth image often occurs because of the inability to achieve exact alignment of the smaller arrays with respect to each other. Another important problem with simply abutting chips or subunits is that chip or subunit width errors accumulate over the length of the pagewidth array.

IBM Technical Disclosure Bulletin, Vol. 23, No. 5, Oct. 1980 to B. D. Martin et al, entitled "Chip Protective Coating", discloses a chip or wafer having solder balls on one surface thereon. This surface and the balls are coated with a polyimide layer, so that the polyimide around each solder ball serves to envelope it. A shaving operation removes the tops of the balls including the polyimide layer thereover and produces flats for electrical testing or connection.

U.S. Pat. No. 4,645,688 to Makino et al discloses a composition for coating material of a semiconductor which consists of principal elements of a semiconductor memory element, an encapsulating layer containing an inorganic material and an intermediate layer of a protective coating material.

U.S. Pat. Nos. 4,690,391; 4,712,018 and 4,735,671 to Stoffel et al disclose a method for fabricating long full width scanning arrays. Smaller arrays are assembled in abutting end-to-end relationship by an aligning tool having predisposed pin-like projections insertable in locating grooves in a surface of the smaller arrays. Vacuum ports in the aligning tool surface to draw the smaller arrays into tight face-to-face contact with the tool. A suitable base is then affixed to the aligned small arrays and the aligning tool withdrawn leaving a full width scanning array composed of a row of end-to-end abutted smaller arrays.

SUMMARY OF THE INVENTION

It is an object of the present invention to provide a cost effective method of fabricating a full pagewidth scanning or imaging array from a plurality of relatively short scanning or imaging subunits and concurrently to provide the required alignment precision.

It is another object of this invention to provide a method of fabricating a pagewidth scanning or imaging array from an end-to-end assembly of relatively short scanning subunits wherein the subunit surfaces are coplanar even though the subunits have different thicknesses.

It is still another object of this invention to provide a method of fabricating a pagewidth scanning or imaging array from a plurality of subunits so that the subunit width variations and/or errors are nonaccumulative over the length of the pagewidth array.

In the present invention, a method for fabricating a coplanar full pagewidth scanning or imaging array from a plurality of relatively short scanning or imaging subunits is disclosed. Except for their thickness, the subunits are generally identical. In one embodiment, a plurality of scanning element arrays, together with their associated circuitry, are formed on a planar substrate, such as a silicon wafer. The scanning element arrays and associated circuitry are coated with a thick film photopatternable layer which is patterned to form one or more shapes, preferably two, per scanning element array which are subsequently to be used as keys, and then the wafer is diced to produce the subunits. As the planar substrates may vary slightly in thickness, so do the subunits from different substrates or wafers. By using a flat alignment fixture containing a patterned, thick film photopatternable layer to provide keyways open at one end to accommodate the shapes of the keys on the subunits, they are precisely colinearly aligned on the alignment fixture. The one or more shapes or keys on each subunit provide three basic functions; viz., they accurately align the subunits end-to-end, they act as spacer to protect the scanning elements and associated circuitry by preventing contact with the alignment fixture, and finally they equally space the subunit surface from the alignment fixture, regardless of subunit thickness. When nonaccumulation subunit width errors over the pagewidth array are a concern, the subunit widths are slightly undersized so that adjacent subunits do not touch, but the keys and keyways maintain the alignment and coplanarity of the pagewidth array. A conformal adhesive is applied to the surface of a flat structural member, and the structural member is placed on the assembled subunits while they are still in the alignment fixture, residing upside down with the conformal adhesive sandwiched therebetween. After the adhesive is cured, the structural member containing the precision colinearly aligned subunits are removed from the alignment fixture. With the subunits colinearly fixed to the structural member. The subunit surfaces containing the scanning elements in each full width scanning array are all coplanar.

A more complete understanding of the present invention can be obtained by considering the following detailed description in conjunction. with the accompanying drawings, wherein like parts have the same index numerals.

DESCRIPTION OF THE PREFERRED EMBODIMENT

Figure 1:
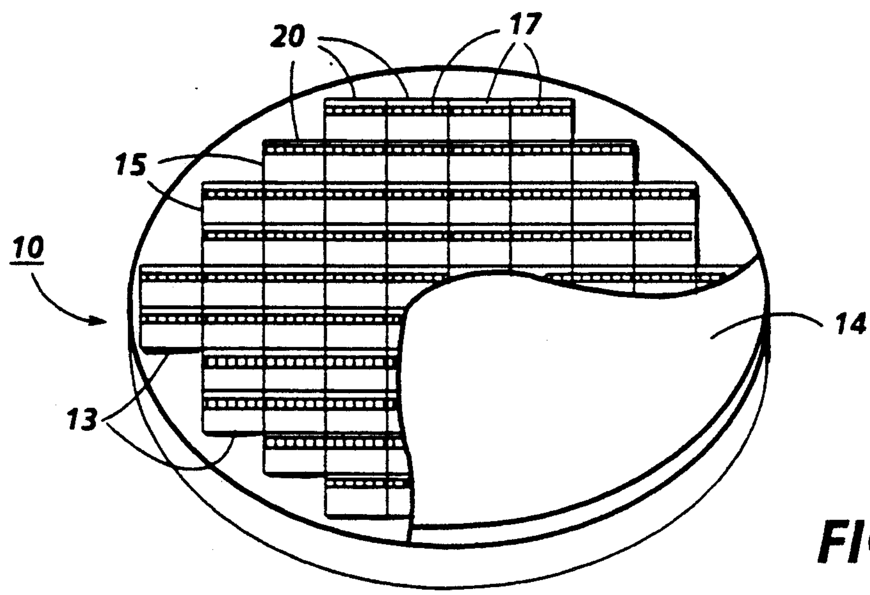
FIG. 1 is a schematic isometric view of a wafer containing a plurality of small scanning array subunits of the present invention thereon. Individual subunits are produced by dicing.
Figure 1A:
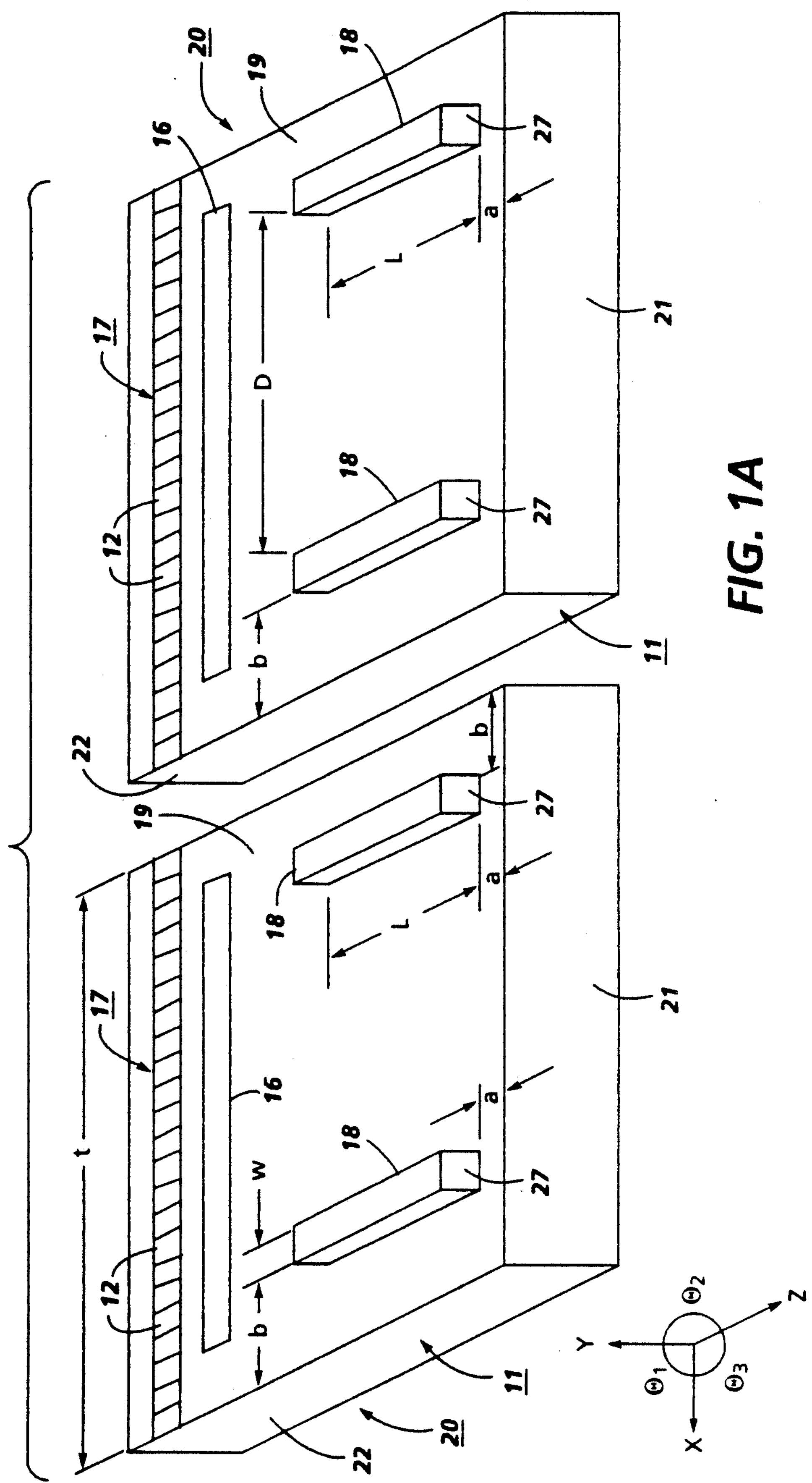
FIG. 1A is an enlarged isometric view of two of the scanning array subunits of FIG. 1 obtained from the dicing operation, showing the pairs of thick film strips patterned thereon which function as keys to aid in precision end-to-end assembly.

In FIGS. 1 and 1A, a planar substrate 10 is shown, such as, for example, a silicon wafer having a plurality of sets or linear arrays of scanning, imaging, or sensing elements 12 and associated control circuitry 16 formed thereon. A thick film photopatternable layer 14, partially shown in FIG. 1, such as polyimide, is deposited and patterned to form, for example, pairs of accurately located and dimensioned keys 18. Mutually perpendicular lines 13 and 15 in FIG. 1 delineate the dicing lines for cutting the substrate 10 into a plurality of relatively small scanning array subunits 20.

Referring to FIG. 1A, there is shown a scanning sensor array chip or subunit 20 for use in fabricating the full width scanning array of the present invention. As will appear, the present invention enables a plurality of relatively short scanning array subunits 20 to be assembled or placed on a base structural member 30 (shown in FIGS. 3 and 4) in aligned end-to-end relation to form a full pagewidth long composite scanning array assembly 40, also shown in FIGS. 3 and 4. Preferably, the length of the full width array is made equal to the maximum size in the scan direction "Z" off the image to be processed. The composite, full width scanning array may be formed from either a series of image read arrays (i.e., Charge Coupled Devices, photodiodes, etc.) to provide a composite read array for scanning document originals and converting the document image to electrical signal or pixels, or a series of image write arrays (i.e., Light Emitting Diodes laser diodes, magnetic heads, or other printing heads, such as ink jet printheads) to provide a composite write array for writing images on a suitable imaging member or recording medium, such as, for example, a photoconductor for a xerographic copying system or paper for an ink jet printer in accordance with an image signal or pixel input.

Figure 3:
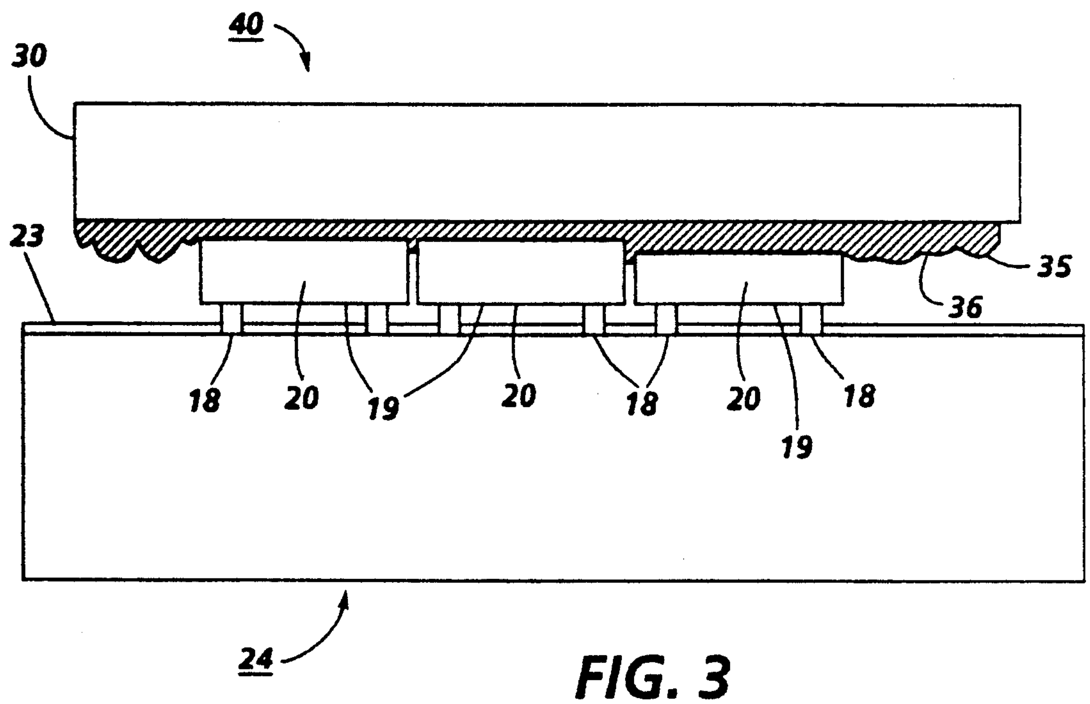
FIG. 3 is a schematic front elevation view of the assembled scanning array subunits mounted on the aligning fixture with the mounting structural member bonded to the scanning array subunits with a conformal adhesive.
Figure 4:
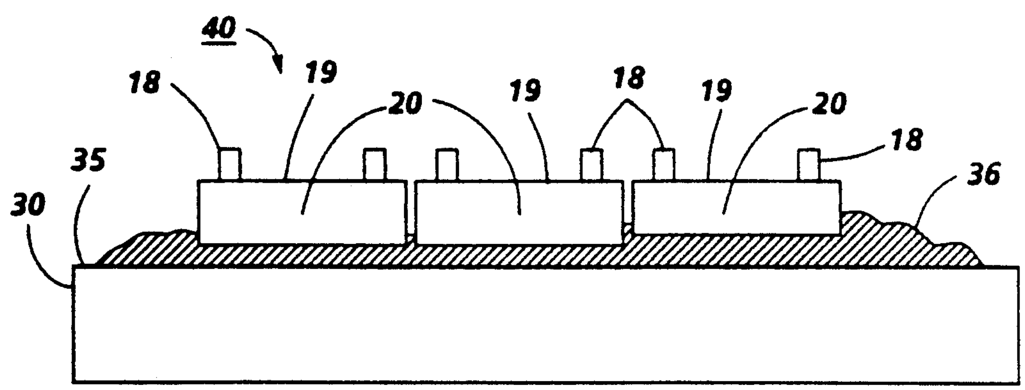
FIG. 4 is a schematic front elevation view of the assembled pagewidth scanning array after removal from the aligning fixture.

Scanning array subunit 20 includes a generally rectangular base 11, which is preferably silicon and obtained by dicing wafer 10 along dicing lines 13, 15. Each subunit 20 has a plurality of sensors 12 arranged in a linear row or array 17 in one surface 19 thereof. Sensor row 17 is parallel to side edge 21 of the subunit base 11. Cooperating control circuitry 16, which may include logic gates and a shift register (not shown), can also be integrated onto the subunit base 11 for controlling operation of the sensors or scanning elements 12. Sensors or scanning elements 12 may, for example, comprise photodiodes adapted to convert image rays impinging thereupon to electrical signals or pixels in the case of a read array or LEDs selectively operated in response to an image signal input to produce image rays corresponding to the image represented by the image signals for exposing an imaging member (not shown) or for pulsing bubble generating resistors in a thermal ink jet printer (not shown). To permit scanning array subunit 20 to be joined in abutting relation with other like subunits (as seen in FIGS. 3 and 4), the row 17 of scanning elements or sensors 12 extend to the ends 22 of the base 11.

To enable scanning array subunit 20 to be accurately and exactly colinearly aligned in end-to-end abutment with other like subunits, as will be explained more fully later, predetermined subunit aligning formations or keys, comprising, for example, a pair of longitudinally extending parallel strips 18 of photopatternable thick film polymer material, such as polyimide, patterned from thick film layer 14, are provided on the surface 19 of subunit base 11. In the embodiment shown in FIG. 1A, the parallel strips 18 extend in the Z direction or scanning direction and are substantially perpendicular to the side edge 21 and parallel to ends 22 of subunit base 11. The pair of parallel strips 18 have predetermined dimensions of width W and length L, and are located on subunit surface 19 a distance "a" from subunit side edge 21 and a distance "b" from subunit ends 22. The strips 18 are spaced apart by distance D. The thick film layer 14 and therefore the thickness of the keys may have a thickness between 0.5 and 2 mils (20 to 80 $\mu$m).

Figure 2A:
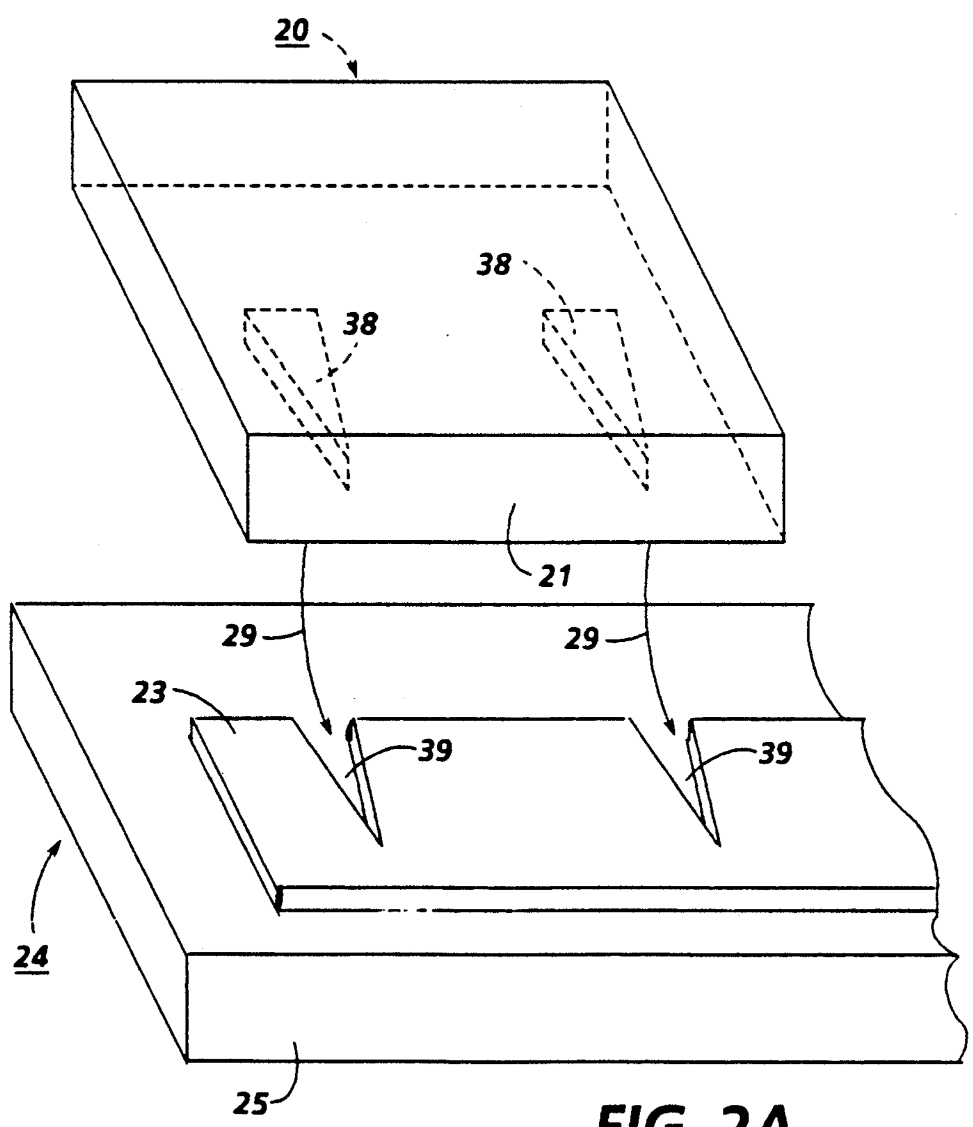
FIG. 2A is a partially shown schematic isometric view of the aligning fixture having keys and mating keyways with an alternate configuration.
Figure 2:
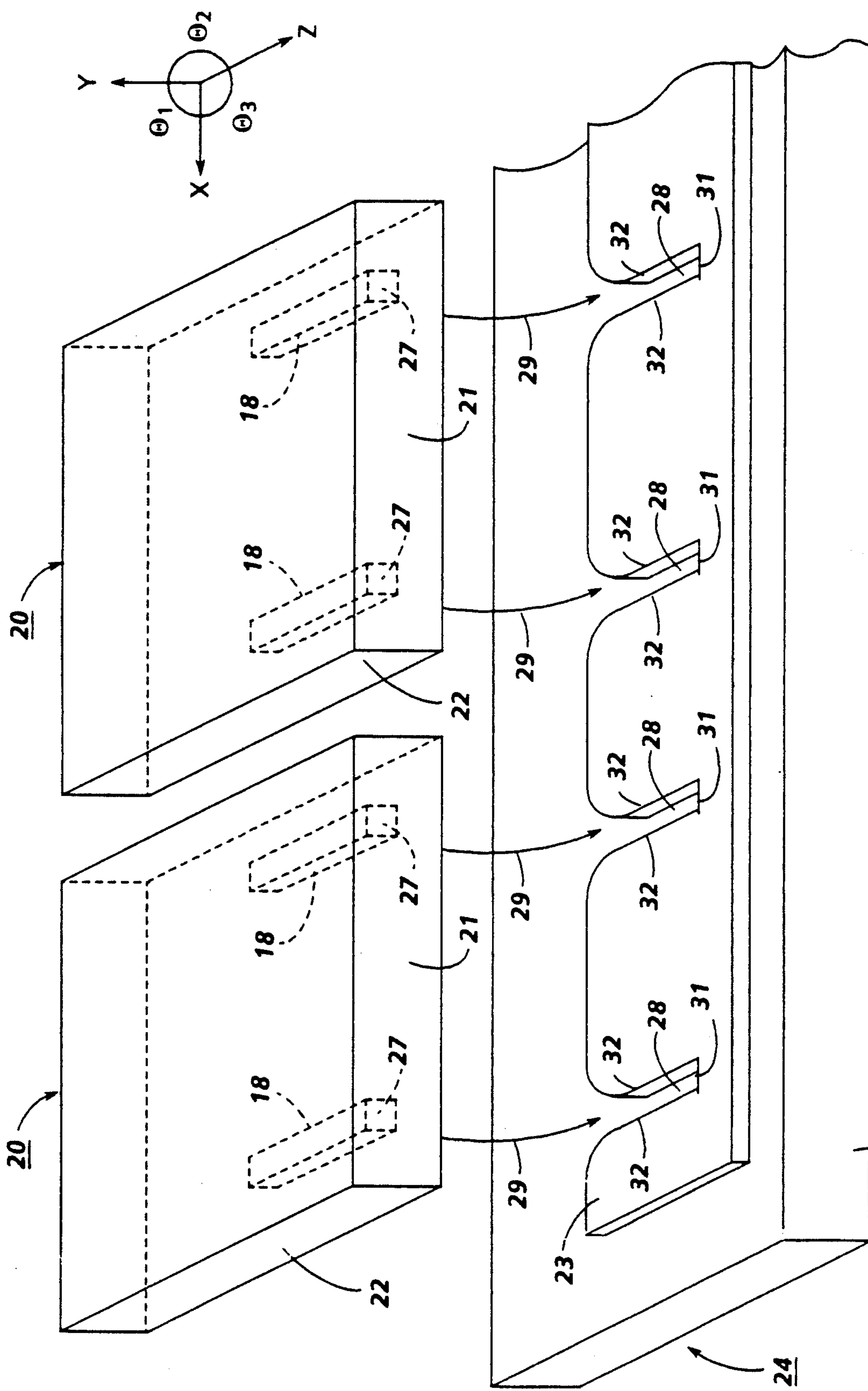
FIG. 2 is a partially shown schematic isometric view of the aligning fixture having keyways patterned from a thick film layer with the scanning array subunits inverted for ready mating of their keys into the aligning fixture's keyways.

Referring to FIG. 2, an aligning fixture 24 is shown which comprises a flat substrate 25 containing on surface 26 thereof a patterned thick film layer 23 of photopatternable material such as polyimide to define keyways 28 dimensioned to accept accurately the parallel strips 18 of subunits 20. The patterned thick film layer 23 has a thickness equal to or less than the thickness of the subunit strips 18. By using a high tolerance dicing machine, the adjacent scanning elements 12 on adjacent subunits may be assembled to within 1 to 2 micrometers of each other in the aligning fixture and thus provide a high resolution full width scanning array 40 after assembly. Therefore, the slightly undersized, adjacent subunits do not necessarily touch each other, so that subunit width errors or out of tolerance variations do not accumulate over the length of the fully assembled, pagewidth array. In order to use the aligning fixture 24, the subunits must be inverted and the strips or keys 18, shown in dashed line in FIG. 2, inserted into the keyways 28 as indicated by arrows 29. With the subunits inverted or flipped, the sensors and associated control circuitry are spaced from the aligning fixture surface 26 and thus are protected from harm during the assembly process.

During assembly of the subunits 20 into a full width scanning array 40, the ends 27 of the parallel strips or keys 18 of subunit 20 are tightly brought into contact with the keyway bottoms 31. The accurately formed keyway sidewalls 32 cooperate with the pairs of subunit strips 18 to center the subunits, thereby accurately locating each subunit 20 in X, Z, and Θ space, while the uniform thickness of the subunit strips 18 provide coplanarity of the subunit surface 19, referred to as the Y direction according to the coordinates depicted in FIGS. 1A and 2.

An alternate embodiment is shown in FIG. 2A. In this embodiment, the keys 38 are patterned in a triangular shape and the keyways 39 have a complementary shape to receive the keys of the subunit and accurately locate the subunits relative to each other and the aligning fixture. Other shapes (not shown) could be used for the keys and keyways, of course, such as circles, diamonds, etc. to assemble the subunits. The aligning fixture could have several rows of keyways (not shown) which would enable fabrication of a number of two dimensional arrangements of scanning, imaging, or printing subunits into any desired configuration for higher density and higher resolution devices.

As shown in FIGS. 2, 3 and 4, all the scanning array subunits 20 are assembled, i.e. placed upside down on the aligning fixture 24, which are required to produce a full width scanning array 40. The keys 18, when placed into the keyways 28 of the thick film layer 23 of the aligning fixture 24, provide precision colinear alignment of a plurality of subunits 20. A conformal adhesive 36 such as Epotek H20-E®, is applied to surface 35 of structural member 30 which forms part of the full width scanning array. The structural member provides the strength to the full width array to prevent cracking or other structural failure modes of the abutted assembly of subunits 20. The structural member is inverted and the conformal adhesive 36 pressed against the bottom surfaces of the subunits, which reside upside down on the aligning fixture. The top or opposite the surfaces 19 contain the sensors, circuitry, and pair of aligning strips 18. The aligning strips, as indicated above, accurately and colinearly locate the subunits, space the sensors and control circuitry from the aligning fixture, and provide the coplanarity of the subunit surface 19. For sake of clarity, only three subunits are shown, although actually a large number may be required depending on the overall subunit width "t" (refer to FIG. 1A); in the preferred embodiment, t is between 5 and 7 mm ±2 micrometers, but may extend from 1 to 10 mm. After the adhesive 36 is cured, the structural member 30 with the subunits 20 colinearly adhered or fixed thereto is removed from the aligning fixture 24 leaving the unitary composite full width array 40 shown in FIG. 4.

Other shapes, combinations, and locations for array aligning formations may be used instead of cooperating thick film elongated keys and mating keyways shown and described herein, including a single key instead of a pair. Also, the keys and keyways may be fabricated by electroplating or high precision machining techniques instead of photopatterning a photosensitive thick film layer.

Accordingly, many modifications and variations are apparent from the foregoing description of the invention and all such modifications and variations are intended to be within the scope of the present invention.

We claim:

1. A method for fabricating a coplanar full width scanning or imaging array on a flat structural member from relatively short linear scanning or imaging subunits by precision colinear placement, even though the subunits' scanning or imaging elements and associated circuitry are on one surface thereof with at least some of the subunits having different thicknesses, comprising the steps of:

(a) depositing and patterning a thick film, photopatternable layer on the surface of the subunits which contain the scanning or imaging elements and associated circuitry to form one or more thick film keys thereon;

(b) providing a pagewidth alignment fixture comprising a substrate having a flat surface and a patterned thick film photopatternable layer on the flat surface, the patterned thick film layer having a plurality of accurately located keyways which have shapes complementary to the keys of the subunits, the keyways being open at one end and closed at the other for precision alignment of the subunits on the alignment fixture;

(c) inverting the subunits and inserting the subunit keys into the alignment fixture keyways, so that one end of the keys contact the closed end of the keyways;

(d) coating a conformal adhesive on a surface of the structural member;

(e) placing the conformal adhesive on the structural member in contact with the surface of the subunits residing upside down with the subunit keys residing in the keyways of the alignment fixture;

(f) curing the adhesive; and (g) removing the structural member with the accurately positioned scanning subunits bonded thereto, the surfaces of the subunits being precisely colinearly fixed to form a pagewidth scanning or imaging array in which all of the surfaces of the subunits are coplanar even though the thicknesses of the subunits vary.

2. The method of fabricating the full width array of claim 1, wherein the key shapes in step (a) are two parallel strips and the complementary keyways in step (b) are in the form of a pair of parallel slots.

3. The method of claim 2, wherein the thick film, photopatternable layers of the subunits and alignment fixture are polyimide, and the thickness of the thick film layers are 20 to 80 μm, the thickness of the keyways being equal to or less than that of the subunit keys in order to space the scanning or imaging elements and associated circuitry from the alignment fixture, and wherein the spacing between each pair of keyways of the alignment fixture is such that the subunits aligned thereon have a clearance of 1 to 2 μm between each adjacent subunit.

4. The method of fabricating the full width array according to claim 1, wherein the key shapes in step (a) and keyway shapes in step (b) are triangular.

5. The method of claim 4, wherein the thick film, photopatternable layers of the subunits and alignment fixture are polyimide, and the thickness of the thick film layers are 20 to 80 μm, the thickness of the keyways being equal to or less than that of the subunit keys in order to space the scanning or imaging elements and associated circuitry from the alignment fixture, and wherein the spacing between each pair of keyways of the alignment fixture is such that the subunits aligned thereon have a clearance of 1 to 2 μm between each adjacent subunit.

6. The method fabricating the full width array of claim 1, wherein the alignment fixture has more than one row of keyways for two dimensional full width array configurations.

7. A method for fabricating a coplanar full width scanning or imaging array on a flat structural member from relatively short linear scanning or imaging subunits by precision colinear placement, even though the subunits' scanning or imaging elements and associated circuitry are on one surface thereof with at least some of the subunits having different thicknesses, comprising the steps of:

(a) forming a plurality of sets of relatively short, linear scanning or imaging elements and associated circuitry for each set of elements on a planar substrate;

(b) depositing and patterning a thick film, photopatternable layer on the surface of the planar substrate having the sets of scanning or imaging elements to form one or more thick film keys for each set of elements thereon;

(c) dicing the planar substrate to produce a plurality of subunits each containing a set of scanning or imaging elements, associated circuitry, and thick film keys;

(d) providing a pagewidth alignment fixture comprising a substrate having a flat surface and a patterned thick film photopatternable layer on the flat surface, the patterned thick film layer having a plurality of accurately located keyways which have shapes complementary to the keys of the subunits, the keyways being open at one end and closed at the other for precision alignment of the subunits on the alignment fixture;

(e) inverting the subunits and inserting the subunit keys into the alignment fixture keyways, so that one end of the keys contact the closed end of the keyways;

(f) coating a conformal adhesive on a surface of the structural member;

(g) placing the conformal adhesive on the structural member in contact with the surface of the subunits residing upside down with the subunit keys residing in the keyways of the alignment fixture;

(h) removing the structural member with the accurately positioned scanning subunits bonded thereto, the surfaces of the subunits being precisely colinearly fixed to form a pagewidth scanning or imaging array in which all of the surfaces of the subunits are coplanar even though the thicknesses of the subunits vary.

* * * * *